US011159872B1

(12) United States Patent
Maguire et al.

(10) Patent No.: US 11,159,872 B1
(45) Date of Patent: Oct. 26, 2021

(54) WEARABLE AUDIO DEVICE MAGNETOMETER COMPENSATION

(71) Applicant: Bose Corporation, Framingham, MA (US)

(72) Inventors: Stephen J. Maguire, Grafton, MA (US); Jordan J. Bonner, Waltham, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 16/857,426

(22) Filed: Apr. 24, 2020

(51) Int. Cl.
*H04R 1/10* (2006.01)
*H04R 1/32* (2006.01)

(52) U.S. Cl.
CPC ............. *H04R 1/1041* (2013.01); *H04R 1/32* (2013.01)

(58) Field of Classification Search
CPC ........ H04R 1/1041; H04R 1/32; H04R 1/323; H04R 3/00; H04R 3/007; H04R 2499/11; H04R 2400/11; H04R 9/025; H04R 1/1025; H04R 1/1016; H04R 3/08
USPC ........... 381/74, 150, 376, 380–381, 370–371
See application file for complete search history.

(56) References Cited

U.S. PATENT DOCUMENTS

| 10,555,071 | B2 | 2/2020 | Wakeland et al. |
| 2015/0215719 | A1* | 7/2015 | Turgul ................ H04R 1/1091 381/58 |
| 2017/0066464 | A1* | 3/2017 | Carter .................... G05D 1/028 |
| 2017/0308689 | A1* | 10/2017 | Boesen ................... G06F 3/167 |
| 2018/0257688 | A1* | 9/2018 | Carter ............... G08B 13/1654 |
| 2020/0194028 | A1* | 6/2020 | Lipman ................... G01S 3/802 |
| 2020/0336856 | A1* | 10/2020 | Khaleghimeybodi .. H04S 7/301 |

* cited by examiner

*Primary Examiner* — Disler Paul
(74) *Attorney, Agent, or Firm* — Brian M. Dingman; Dingman IP Law, PC (57) ABSTRACT

A wearable audio device that includes an electro-acoustic transducer for creating audio output and a magnetometer system comprising a magnetic field sensor with an output, a temperature sensor that is configured to determine an internal device temperature, a processor, and memory. The magnetometer system is configured to derive from the magnetic field sensor output a directional heading of the Earth's magnetic field. The magnetometer system is further configured to compensate the magnetic field sensor output, wherein the compensation is temperature dependent. The memory is configured to store temperature-dependent compensation information. The magnetometer system is further configured to use the temperature sensor output to retrieve compensation information from the memory in order to compensate the magnetic field sensor output at the current temperature.

12 Claims, 6 Drawing Sheets

WEARABLE AUDIO DEVICE MAGNETOMETER COMPENSATION

BACKGROUND

This disclosure relates to a wearable audio device.

Wearable audio devices such as audio-enabled eyeglass headphones and earphones (e.g., earbuds or headphones) can include orientation tracking systems that use a magnetometer to track motions of the head and the direction in which the wearer is facing. Magnetometers need to accurately detect the Earth's magnetic field. The wearable audio device's electro-acoustic transducer typically includes a magnet. The wearable audio device may also include magnet material such as steel. The wearable audio device can also include a magnet used to dock or park the wearable audio device to another structure. Since the electro-acoustic transducer, the magnetometer, steel used to house the transducer and/or the docking magnet of many wearable audio devices are in close proximity, the magnetic field of the other magnets and the magnetic field aberrations caused by steel can inhibit the magnetometer from accurately sensing the Earth's magnetic field.

SUMMARY

All examples and features mentioned below can be combined in any technically possible way.

In one aspect, a wearable audio device includes an electro-acoustic transducer for creating audio output, and a magnetometer system comprising a magnetic field sensor with an output. The magnetometer system is configured to derive from the magnetic field sensor output a directional heading of the Earth's magnetic field. The magnetometer system is further configured to compensate the magnetic field sensor output, wherein the compensation is temperature dependent. The magnetometer system is further configured to use a temperature in order to compensate the magnetic field sensor output.

Some examples include one of the above and/or below features, or any combination thereof. In some examples the wearable audio device also includes structure that is constructed and arranged to be positioned so as to direct the audio output into the environment adjacent to the wearable audio device. In an example the structure that is constructed and arranged to be positioned so as to direct the audio output into the environment adjacent to the wearable audio device comprises an earbud body. In an example the structure that is constructed and arranged to be positioned so as to direct the audio output into the environment adjacent to the wearable audio device comprises an eyeglass temple. In an example the electro-acoustic transducer and the magnetometer system are carried by the eyeglass temple. In an example the electro-acoustic transducer and the magnetometer system are located inside of the eyeglass temple. In an example the structure that is constructed and arranged to be positioned so as to direct the audio output into the environment adjacent to the wearable audio device comprises a portion of an on-ear headphone.

Some examples include one of the above and/or below features, or any combination thereof. In some examples the magnetometer system further comprises a temperature sensor that is configured to determine an internal temperature, a processor, and memory. In an example the memory is configured to store temperature-dependent compensation information. In an example the processor is configured to use the determined internal temperature to retrieve compensation information from the memory. In an example the temperature-dependent compensation information is determined for a plurality of wearable audio devices and a composite of these determinations is stored in the memory. In an example the temperature-dependent compensation information is determined relative to a reference temperature.

Some examples include one of the above and/or below features, or any combination thereof. In some examples the magnetometer system is configured to compensate the magnetic field sensor output when a magnetic field emanating from the wearable audio device is greater than a threshold level. In an example the magnetic field emanating from the wearable audio device is at least in part from one or both of a transducer magnet and a coupling magnet for coupling the wearable audio device to another structure.

Some examples include one of the above and/or below features, or any combination thereof. In an example the magnetometer system is configured to compensate the magnetic field sensor output when the internal temperature exceeds a reference temperature by more than a predetermined amount. In an example the magnetometer system is further configured to compensate the magnetic field sensor output to reduce heading errors, where heading errors are caused at least in part by at least one of a magnet of the electro-acoustic transducer, a coupling magnet for coupling the wearable audio device to another structure, and magnetic material of the wearable audio device.

In another aspect an eyeglass headphone includes an electro-acoustic transducer for creating audio output, the electro-acoustic transducer producing a stray magnetic field. There is a temple piece constructed and arranged to be positioned proximate an ear of a wearer and to direct the audio output into the environment adjacent to the temple piece. There is also a magnetometer system carried by the temple piece and comprising a magnetic field sensor with an output, a temperature sensor that is configured to determine the device's internal temperature, a processor, and memory, the magnetometer system configured to derive from the magnetic field sensor output a directional heading of the Earth's magnetic field. The magnetometer system is further configured to compensate the magnetic field sensor output to reduce heading errors caused at least in part by the stray magnetic field, wherein the compensation is temperature dependent. The memory is configured to store temperature-dependent compensation information. The magnetometer system is further configured to use the temperature sensor output to retrieve compensation information from the memory in order to compensate the magnetic field sensor output at the internal temperature.

Some examples include one of the above and/or below features, or any combination thereof. In an example the temperature-dependent compensation information is determined for a plurality of wearable audio devices and a composite of these determinations is stored in the memory. In an example the magnetometer system is configured to compensate the magnetic field sensor output when the stray magnetic field is greater than a threshold level. In an example the stray magnetic field is at least in part from a transducer magnet.

Some examples include one of the above and/or below features, or any combination thereof. In an example the eyeglass headphones also include a magnetic field from a coupling magnet for coupling the eyeglass headphones to another structure. In an example the magnetometer system is configured to compensate the magnetic field sensor output when the internal temperature exceeds a reference temperature by more than a predetermined amount. In an example the stray magnetic field is caused at least in part by at least one of a magnet of the electro-acoustic transducer and magnetic material of the electro-acoustic transducer.

DETAILED DESCRIPTION

Some examples of this disclosure describe a type of wearable audio device that is known as a headphone or earbud. Headphones generally deliver sound into a closed or partially-closed volume in the outer ear. Earbuds generally deliver sound directly into the user's ear canal. Other examples of this disclosure describe a type of wearable audio device that is known as an open audio device. Open audio devices have one or more electro-acoustic transducers (i.e., audio drivers) that are located off of the ear canal opening. Open audio devices are further described in U.S. Pat. No. 10,397,681, the entire disclosure of which is incorporated herein by reference for all purposes.

The term headphone is often used to refer to a device that typically fits around, on, or in an ear and that radiates acoustic energy directly or indirectly into the ear. Headphones are sometimes referred to as earphones, earpieces, headsets, earbuds, or sport headphones, and can be wired or wireless. A headphone includes an electro-acoustic transducer (driver) to transduce electrical audio signals to acoustic energy. The acoustic driver may or may not be housed in an earcup. A headphone may be a single stand-alone unit or one of a pair of headphones (each including at least one acoustic driver), one for each ear. A headphone may be connected mechanically to another headphone, for example by a headband and/or by leads that conduct audio signals to an acoustic driver in the headphone. A headphone may include components for wirelessly receiving audio signals. A headphone may include components of an active noise reduction (ANR) system. Headphones may also include other functionality, such as a microphone.

In an around the ear or on the ear or off the ear headphone, the headphone may include a headband or other support structure and at least one housing or other structure that contains a transducer and is arranged to sit on or over or proximate an ear of the user. The headband can be collapsible or foldable, and can be made of multiple parts. Some headbands include a slider, which may be positioned internal to the headband, that provides for any desired translation of the housing. Some headphones include a yoke pivotably mounted to the headband, with the housing pivotally mounted to the yoke, to provide for any desired rotation of the housing.

An open audio device includes but is not limited to an off-ear headphone, i.e., a device that has one or more electro-acoustic transducers that are coupled to the head or ear (typically by a support structure) but do not occlude the ear canal opening. In an example the open audio device is an off-ear headphone comprising audio eyeglasses, but that is not a limitation of the disclosure as the electro-acoustic transducer and the magnetometer system can be used in any device that is configured to deliver sound to or proximate one or both ears of the wearer where there are typically but not necessarily no ear cups. The wearable audio systems contemplated herein may include a variety of devices that include an over-the-ear hook, such as a wireless headset, hearing aid, eyeglasses, a protective hard hat, and other open ear audio devices.

One or more of the devices, systems and methods described herein, in various examples and combinations, may be used in a wide variety of wearable audio devices in various form factors, including but not limited to headphones and various other types of head, shoulder or body-worn acoustic devices (e.g., audio eyeglasses or other head-mounted audio devices) that include one more electro-acoustic transducers to produce sound, with or without contacting the ears of a user. It should be noted that although specific implementations of wearable audio devices primarily serving the purpose of acoustically outputting audio are presented with some degree of detail, such presentations of specific implementations are intended to facilitate understanding through provisions of examples and should not be taken as limiting either the scope of the disclosure or the scope of the claim coverage.

Many wearable audio devices are powered by batteries that must be periodically charged. Battery charging can be accomplished using a charger that may be built into a case that is also configured to store the wearable audio devices when they aren't in use. The charger can alternatively be carried by another structure such as a separate battery charging device. In order for the wearable audio device batteries to properly charge, the wearable audio device must be brought into close proximity to the battery charger, which requires the wearable audio device to be "docked" to the battery charger. Docking of wearable audio devices to a charger is often accomplished using magnetic attraction of the wearable audio device to the correct location of the charger. A docking magnet, located in the wearable audio device such that it is attracted to a magnet or magnetic material in the charger, can be used to help properly locate and orient the wearable audio device in the charger.

Wearable audio devices, in particular earbuds, may also be configured to allow the left and right earbuds to be held or "parked" together when not in use. Earbuds can also be configured to be parked to another structure, such as a neckband. Parking of earbuds is often accomplished with a parking or coupling magnet in the earbud, where the parking or coupling magnet is located such that it is at or very close to the surface of the earbud.

Wearable audio devices can include one or both of a docking magnet and a parking magnet. Wearable audio devices many times include other magnetic devices or materials, for example the transducer magnet of an electro-acoustic transducer, ferrite cores (which may be used in filters, for example), magnetic reed switches, and steel or other magnetic materials. These magnetic devices and materials can cause stray magnetic fields and magnetic field perturbations at the location of the magnetometer or other magnetic field sensor that is used in determining heading information. In an earphone with an electro-acoustic transducer magnet and a magnetometer that is located close to the transducer, the transducer's magnetic field can overwhelm the magnetometer and prevent it from properly detecting the strength of the Earth's magnetic field. Magnetometers typically operate in a stable operational range only if they are compensated for any stray fields or field perturbations.

Wearable audio devices include an electro-acoustic transducer for creating audio output. For wearable audio devices that are configured to determine a directional heading of the Earth's magnetic field there is also a magnetometer system that includes a magnetic field sensor. The magnetometer system is configured to derive from the magnetic field sensor output a directional heading of the Earth's magnetic field. Magnetometer systems are typically enabled to compensate the magnetic field sensor output for offsets due to changes in stray magnetic fields, nearby magnetic materials, and ambient temperature changes. Compensation helps reduce heading errors, particularly in cases where there are stray magnetic fields and/or magnetic materials (such as iron) that are close enough to the magnetometer to affect its sensitivity to the Earth's magnetic field. Compensation can interrupt operation of the directional heading system and thus cause inconvenience for the user. Accordingly, reducing the frequency of magnetometer compensation and reducing the offsets that need to be compensated for will enable better heading accuracy and fewer and shorter compensation-based interruptions to the heading system.

The compensation of some magnetometers is temperature dependent. In such cases the wearable audio device has the ability to determine the wearable audio device's internal temperature. In an example the internal temperature is determined using a temperature sensor. The wearable audio device can also include a processor, and associated memory. The memory can be configured to store temperature-dependent compensation information. In an example the magnetometer system is configured to use the wearable audio device's internal temperature to retrieve compensation information from the memory, in order to compensate for changes in the device's internal stray magnetic fields caused by changes to the device's internal temperature.

Figure 1:
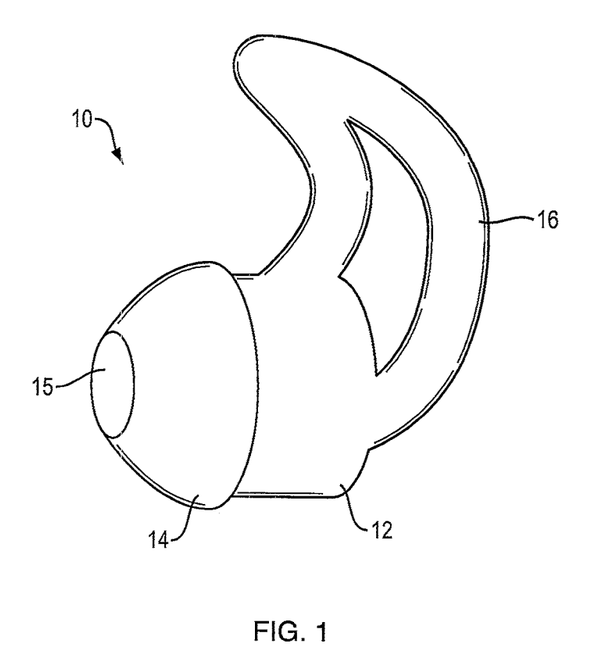
FIG. 1 is perspective view of a headphone.

FIG. 1 is a perspective view of a wireless in-ear headphone or earbud, 10. An earbud is only one non-limiting example of the subject audio device. Other examples are described elsewhere herein. Earbud 10 includes body or housing 12 that houses the active components of the earbud. Portion 14 is coupled to body 12 and is pliable so that it can be inserted into the entrance of the ear canal. Sound is delivered through opening 15. Retaining loop 16 is constructed and arranged to be positioned in the outer ear, for example in the antihelix, to help retain the earbud in the ear. Earbuds are well known in the field (e.g., as disclosed in U.S. Pat. No. 9,854,345, the disclosure of which is incorporated herein by reference), and so certain details of the earbud are not further described herein. An earbud 10 is an example of a wearable audio device according to this disclosure, but is not limiting of the scope of the disclosure as other types of wearable audio devices can include a magnetometer that needs to be compensated.

Figure 2:
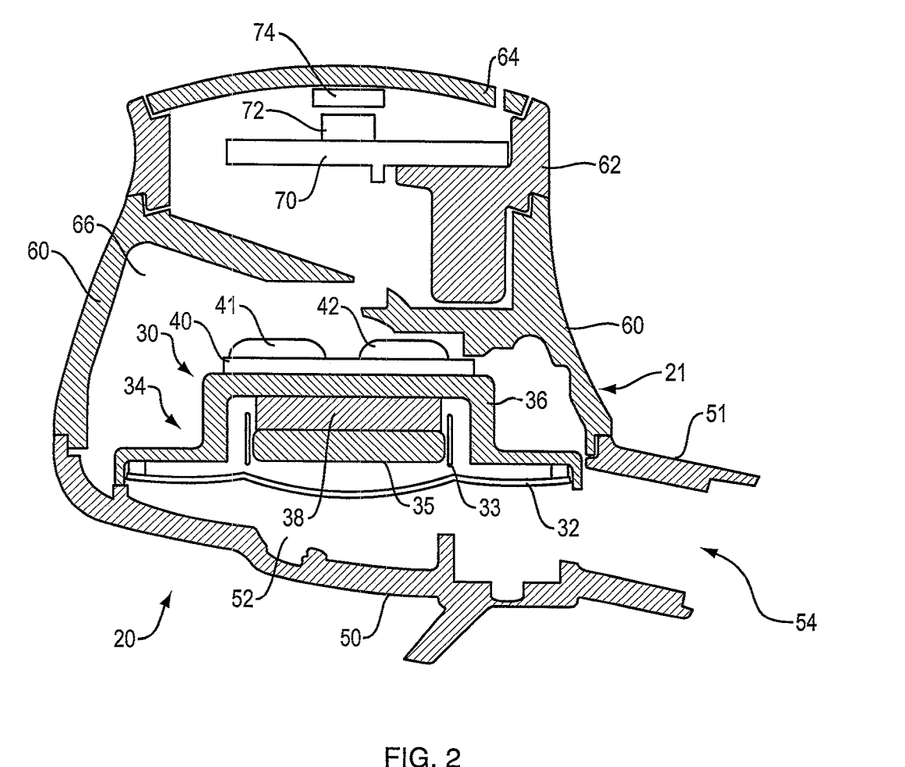
FIG. 2 is a partial cross-sectional view of elements of a headphone.

FIG. 2 is a partial cross-sectional view of only certain elements of an earphone or earbud 20 that are useful to a better understanding of the present disclosure. Earbud 20 comprises housing 21 that encloses electro-acoustic transducer 30. Some or all of housing 21 can be made of steel or another magnetic material. Housing 21 comprises front housing portion 50 and rear housing portions 60 and 62. Transducer 30 has diaphragm 32 that is driven in order to create sound pressure in front cavity 52. Sound pressure is directed out of front housing portion 50 via opening 54. An earbud, such as shown by earbud 10 in FIG. 1, typically includes a pliable tip (not shown) that is engaged with neck 51 of housing portion 50, to help direct the sound into the ear canal. Earbud housing 21 further comprises a rear enclosure made from rear housing portions 60 and 62, and grille 64.

Note that the details of earbud 20 are exemplary of aspects of earphones and are not limiting of the scope of this disclosure, as the present magnetometer compensation can be used in varied types and designs of earphones and other wearable audio devices.

Transducer 30 further comprises magnetic structure 34. Magnetic structure 34 comprises transducer magnet 38 and magnetic material that functions to confine and guide the magnetic field from magnet 38, so that the field properly interacts with coil 33 to drive diaphragm 32, as is well known in the electro-acoustic transducer field. The magnetic material comprises cup 36 and front plate 35, both of which are preferably made from a material with relatively high magnetic susceptibility, also as is known in the field. Transducer printed circuit board (PCB) 40 carries electrical and electronic components (not shown) that are involved in driving the transducer. Pads 41 and 42 are locations where wires (not shown) can be coupled to PCB 40.

Magnetometer system 72 in this non-limiting example is mounted on PCB 70. Magnetometer system 72 includes a magnetic field sensor such as a magnetometer that is arranged to sense the strength of magnetic fields at the location of the magnetometer, as is known in the field. Magnetometer system 72 is configured to detect the Earth's magnetic field. The output of the magnetic field sensor of magnetometer system 72 can be used to determine the direction in which the wearer's head is pointed, as described in U.S. Patent Application Publication 2019/0246235, published on Aug. 8, 2019, the entire disclosure of which is incorporated herein by reference for all purposes.

Since the magnetic field sensor of magnetometer system 72 is relatively close to transducer magnet 38, the transducer's magnetic field can affect the ability of the magnetic field sensor to properly detect the Earth's magnetic field. Parking magnet 74 is in this non-limiting example located just inside of grill 64. It should be understood that a parking magnet is generally located inside of or at least close to (adjacent) the inside surface of earphone housing 21 at a location where it can act to help park the earphone to another structure, such as another earphone housing. Magnet 74 could alternatively be a coupling or docking magnet, which would generally be located inside of or at the inside surface of housing 21 at a location where it can act to help dock or couple the earphone to a battery charger. One possible location of a coupling magnet would be somewhere on the interior of front housing portion 50 inside the front cavity 52. In some examples magnet 74 is also located such that its magnetic field can affect the ability of the magnetic field sensor to properly detect the Earth's magnetic field.

Figure 3:
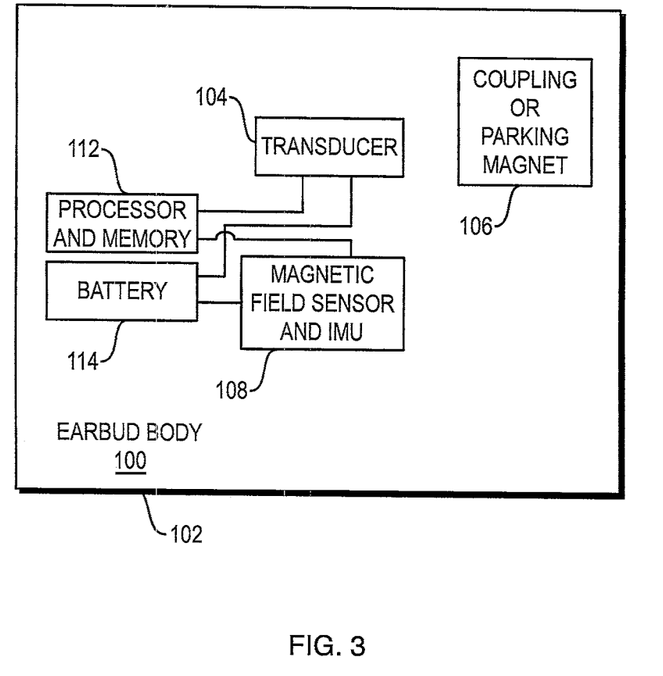
FIG. 3 is a schematic diagram of a headphone.

FIG. 3 is a schematic diagram of in-ear headphone 102, illustrating in part a coupling or parking magnet 106. The described components are located in earbud body 100. Battery 114 provides power to powered components. Processor and associated memory 112 is used, in part, to drive transducer 104. Processor 112 is also used to determine the wearer's look direction, in part using the output of the magnetic field sensor of the combined magnetic field sensor and inertial measurement unit (IMU) functional block 108. It should be understood that earphones will have more components and can have different components than those shown in FIG. 3. Some earphones include a magnet other than the transducer magnet. This other magnet is represented in this non-limiting example by coupling or parking magnet 106. Coupling or parking magnet 106 can be used to couple or park earphone 100 to another structure. As one non-limiting example, magnet 106 can be used to "dock" an earbud to a battery charger. As another non-limiting example, magnet 106 can be used to park an earbud to another structure, such as a neckband or another earbud. Other uses of coupling and/or parking magnets are known in the field and are included within the scope of the present disclosure. All of the magnets in earbud body 100 of earphone 102 create magnetic fields that can adversely impact the accuracy of the sensing of the Earth's magnetic field by sensor 108, as described above.

An effect that stray magnetic fields and materials that perturb the Earth's magnetic field have on the magnetic field sensor of magnetometer system 72 can be compensated for using compensation routines that are known in the technical field. Such compensation routines can entail a complex, lengthy process that might involve user action, such as moving the magnetometer. The need for compensation has a temperature dependency. Accordingly, as the ambient temperature changes the magnetometer might need to be compensated more frequently because its internal stray fields are changing significantly. As an example, a person wearing a wearable audio device such as audio eyeglasses may step out of a warm building into a cold environment. Or, the wearable audio device may absorb strong sunlight, which can heat up the device's internal magnets and cause temperature-dependent changes to their magnetic fields. Wearable audio device temperature changes will cause changes to the device's internal stray magnetic fields, leading to potential errors in directional headings determined by the magnetometer system until the magnetometer is compensated, which might take some time.

The present wearable audio device is configured to use the wearable device temperature in order to address the negative consequences of magnetometer compensation. In an example the wearable device internal temperature is determined using a temperature sensor that is part of the wearable audio device. In an example the wearable audio device includes an IMU with a gyroscope and/or accelerometer. The IMU is involved in the heading determination, as is known in the technical field. Some IMUs include a temperature sensor, which can be used to determine the internal temperature. In an example the wearable audio device is enabled to access the ambient temperature from a temperature sensor of the wearable audio device or from another device or system, or from the cloud. For example if the wearable audio device communicates with a smartphone, the wearable audio device might derive the temperature from the smartphone, or from another source via the smartphone. In an example the wearable audio device's internal temperature can be inferred from the ambient temperature.

The three axis magnetometer is involved in determining the compass heading for the direction that the user is facing. This is complicated by the fact that there can be significant magnetic field biases on the magnetometer axes. Such biases can originate in the wearable device itself. If the temperature were constant, then these internal biases would not change. In order to determine the compass direction the user is facing, the system must compensate for these static biases by offsetting the absolute axis reading by these static biases. As the device temperature begins to change the biases of internal origin also change. Typically, when the biases change by some threshold amount, the system will trigger a dynamic re-compensation in order to compute new biases to be used for axis offset. The system does this because it assumes that the magnetic bias in the environment has changed.

In the present compensation technique, internal bias changes due to internal temperature changes are predetermined. Then the system takes these bias changes into account (i.e., it compensates for them) in its determinations of compass direction. A result is that the system does not need to conduct a dynamic re-compensation as frequently. Thus, the frequency of and the need for user interaction concerning dynamic compensation events for the magnetometer can be lessened. In an example the predetermined temperature-dependent internal bias changes are stored in a memory that is accessible by the processor of the magnetometer system. The magnetometer system can then use the device temperature to retrieve the bias change information for the current internal device temperature, or the processor can be used to interpolate the stored information based on the current temperature and the temperature values that are associated with the stored compensation information. The magnetometer system can be compensated when the temperature changes, using the retrieved information. In an example the temperature-related compensation can occur when the internal device temperature changes by at least a threshold amount from the temperature recorded at its last compensation and its present internal device temperature.

In an example the temperature-dependent compensation information is determined relative to a reference temperature. In an example the magnetometer system is configured to compensate the magnetometer when the internal device temperature exceeds a reference temperature by more than a threshold. In an example one or more wearable audio systems can be exposed to various temperatures under controlled conditions, for example in a factory or in a lab. Appropriate compensation-related information can be measured and stored in the device memory. In an example such information is determined for a number of ostensibly identical wearable audio devices and a composite (such as an average) of this information is stored in the memories of the devices. Or such information can be made available from another device (such as a smartphone) that is in communication with the wearable audio device.

By automatically compensating the magnetometer as the temperature changes, the accuracy of the directional heading determined by the magnetometer system is expected to increase. Also magnetometer recalibration events should be less frequent since the directional heading will remain closer to being correct.

Figure 4:
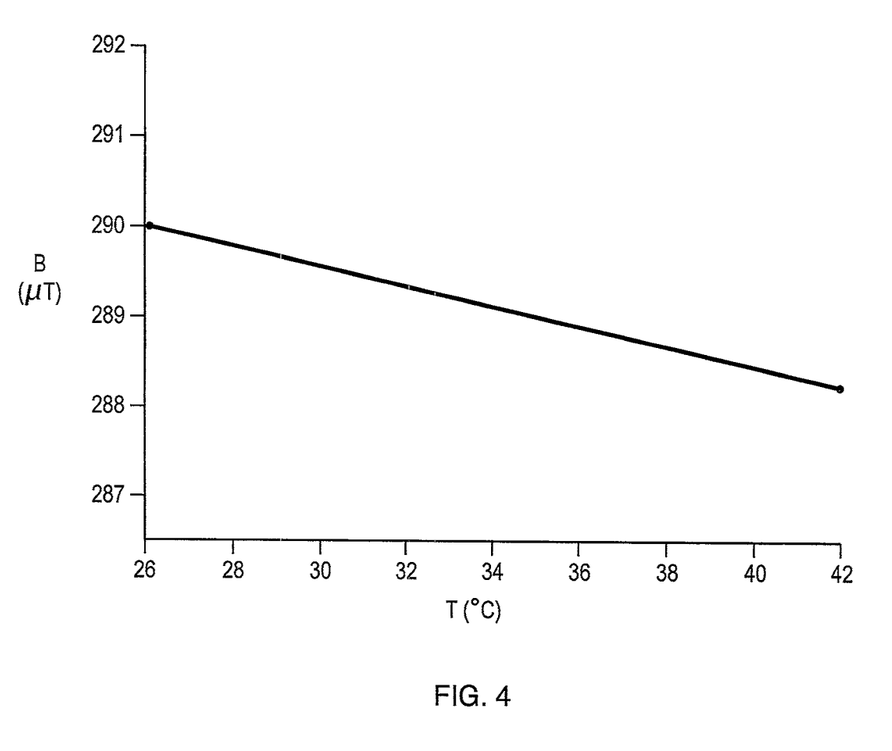
FIG. 4 is a plot of magnetic field offset vs. temperature for an internal magnet of a wearable audio device.

FIG. 4 is an exemplary plot of the magnetic field offset (in micro Tesla) vs. temperature (in degrees C.) for an internal magnet of a wearable audio device. This illustrates the temperature dependency of the magnetic field of a magnet (such as the permanent magnet of an electro-acoustic transducer) of the type that might be used in a wearable audio device. If this field is a stray field that has an effect on the magnetometer, as the temperature of the magnet changes the strength of the stray field changes. As described above, the change in the stray field can detrimentally impact the determination of compass direction by the magnetometer system. If the data plotted in FIG. 4 is stored and used by the system, the changes in stray fields can be accounted for without the need to dynamically compensate the magnetometer.

One or more of the above described systems and methods, in various examples and combinations, may be used in a wide variety of audio systems, including wearable audio devices in various form factors. Unless specified otherwise, the term wearable audio device, as used in this document, includes headphones and various other types of personal audio devices such as head, shoulder or body-worn acoustic devices (e.g., audio eyeglasses or other head-mounted audio devices) that include one more acoustic transducers to receive and/or produce sound, with or without contacting the ears of a user. It should be noted that although specific implementations of wearable audio devices primarily serving the purpose of acoustically outputting audio are presented with some degree of detail, such presentations of specific implementations are intended to facilitate understanding through provisions of examples and should not be taken as limiting either the scope of disclosure or the scope of claim coverage.

Off-ear headphones produce sound using an acoustic driver that is spaced from the ear. Such headphones should ideally deliver high-quality sound to the ears at desired volumes, without spilling too much sound to the environment. Eyeglass headphones can be accomplished with one or more drivers built into the eyeglass frame. Sound can be emitted from openings or vents in the eyeglass frame. If one vent is close to an ear and another vent is farther from the ear, quality sound can be delivered to the ear with minimal spillage. An eyeglass headphone is disclosed in U.S. Pat. No. 10,555,071, issued on Feb. 4, 2020, the entire disclosure of which is incorporated herein by reference for all purposes.

Figure 5:
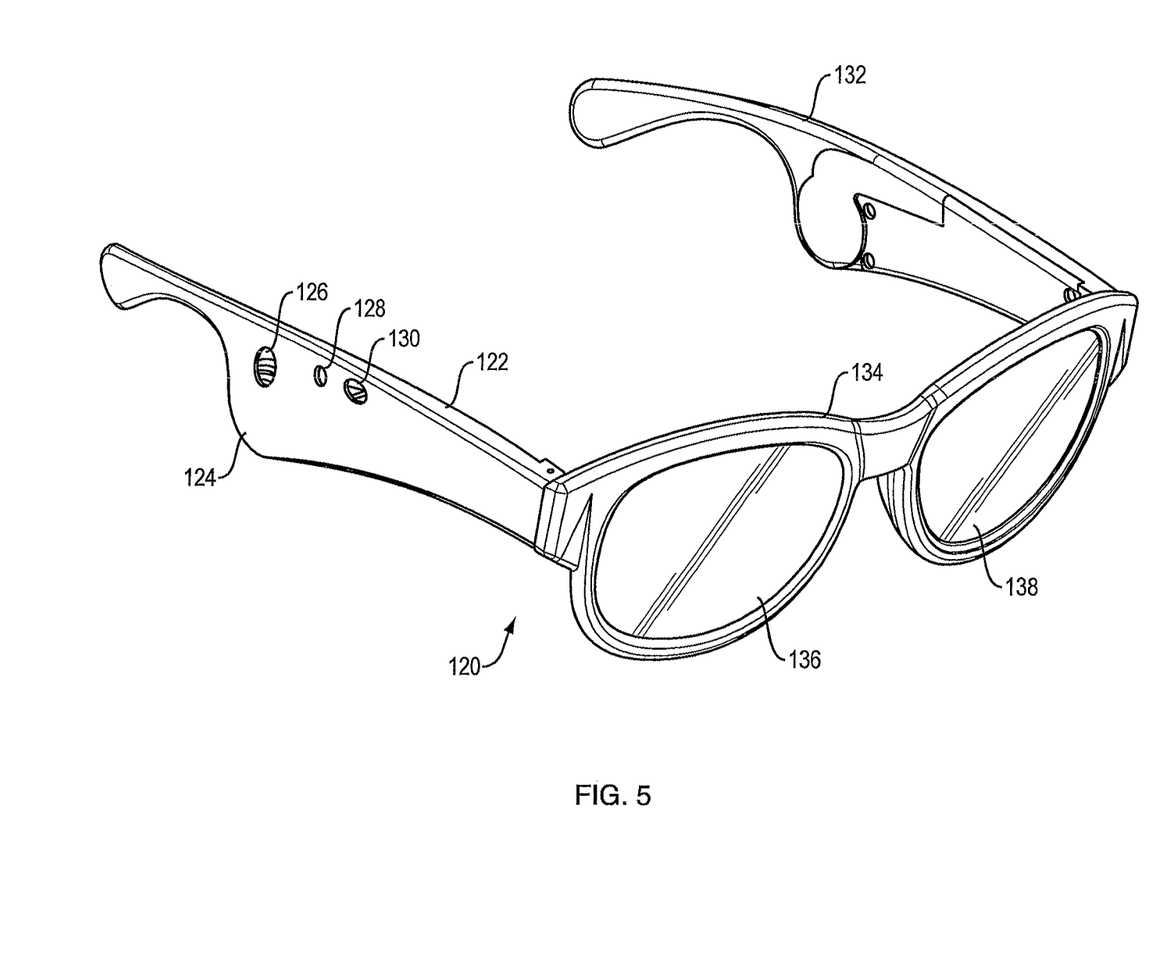
FIG. 5 is a front perspective view of eyeglass headphones.

FIG. 5 is a front, perspective view of eyeglass headphones 120, which are another non-limiting example of an audio device with a magnetic field sensor that could be affected by the stray fields and field perturbations caused by the magnet/magnetic material of the transducer or other structure of eyeglass headphones 120. In this non-limiting example there is an eyeglass bridge 134 that is constructed and arranged to sit on the nose, with lenses 136 and 138 in front of the eyes. Right temple piece 122 is coupled to bridge 134 and extends over the right ear. Left temple piece 132 is coupled to bridge 134 and extends over the left ear. Each temple piece carries a loudspeaker (not shown). The right loudspeaker is carried in section 124 of temple piece 122. Visible in this view are rear high-frequency loudspeaker dipole opening 126, rear low-frequency dipole opening 130, and rear resonance damping opening 128. In another example there are only two sound-emitting openings, one that emits front side acoustic radiation and one that emits rear side acoustic radiation. Any or all of the openings can be covered by a screen. The screen covering opening 128 is preferably resistive to accomplish waveguide resonance damping. Note that in this example the left temple piece 132 has a transducer and sound-emitting opening arrangement that is the same as that disclosed herein for the right temple piece.

Figure 6:
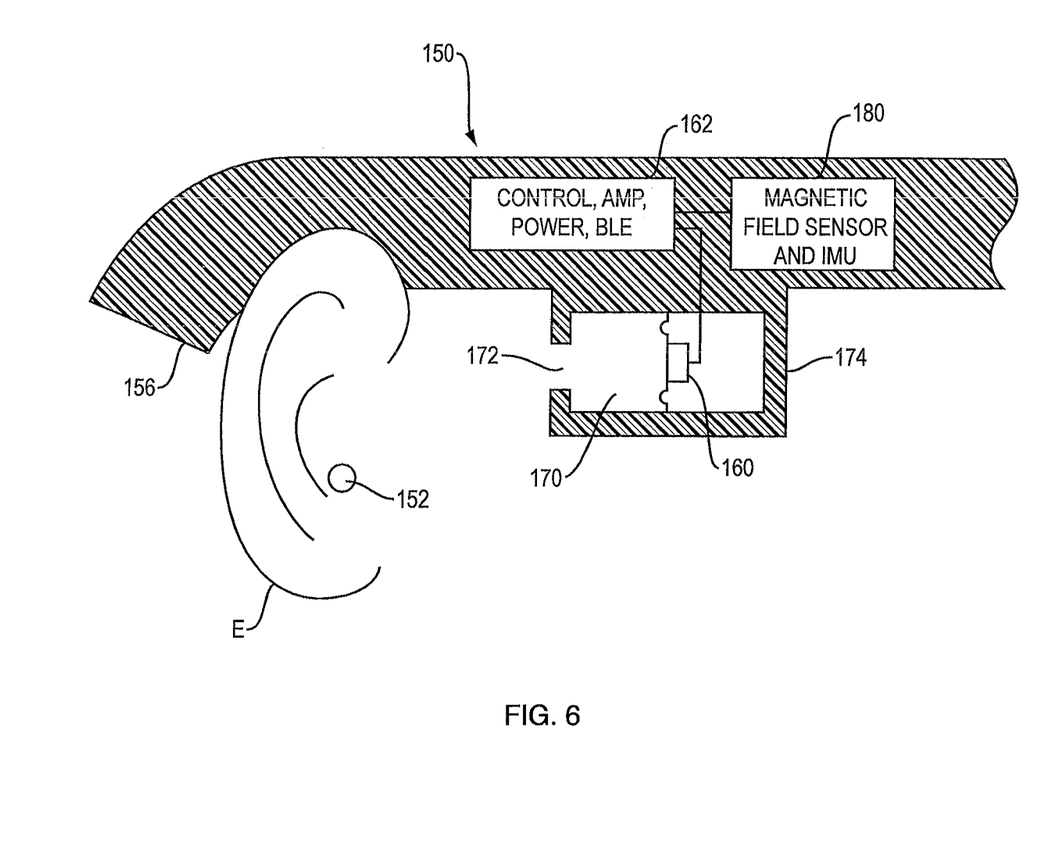
FIG. 6 is a partial cross-sectional schematic view of the right temple piece of eyeglass headphones.

FIG. 6 is a schematic cross-section of a temple piece 156 of eyeglass headphones 150. Eyeglass headphones 150 are another non-limiting example of an audio device with a magnetometer system, as described above. Electro-acoustic transducer 160 is located in housing 174 with front cavity 170. Transducer 160 has a transducer magnet (not shown in this view) that produces a magnetic field. Housing 174 is located such that an acoustic outlet 172 of housing 174 is arranged to direct sound such that the sound can be received by ear canal 152 of the wearer's ear E. Magnetic field sensor and IMU 180 is carried by temple piece 156; sensor and IMU 180 may or may not be located in housing 174. Control, amplification, power and wireless communications (e.g. BLE) module 162 is also carried by the eyeglass headphones 150, and may or may not be carried by temple piece 156.

Elements of FIGS. 3 and 6 are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

Examples of the systems and methods described herein comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other examples are within the scope of the following claims.

What is claimed is:

1. A wearable audio device, comprising:
   a housing;
   an electro-acoustic transducer in the housing for creating audio that is directed out of the housing, wherein the transducer comprises a transducer magnet that has a transducer magnetic field;
   a coupling magnet in the housing and configured to couple the housing to another structure, wherein the coupling magnet has a coupling magnetic field;
   a magnetometer system in the housing and comprising a magnetic field sensor that is configured to detect the Earth's magnetic field and has an output, the magnetometer system configured to derive from the magnetic field sensor output a directional heading of the Earth's magnetic field, wherein the magnetic field sensor is located within both the transducer magnetic field and the coupling magnetic field such that the transducer magnetic field and the coupling magnetic field affect the magnetic field sensor's detection of the Earth's magnetic field;

wherein the magnetometer system is further configured to compensate the magnetic field sensor output, wherein the compensation is temperature dependent;

a temperature sensor that is configured to determine an internal temperature in the housing; and a processor and associated memory in the housing, wherein the memory is configured to store temperature-dependent system compensation information, and wherein the processor is configured to use the determined internal housing temperature to retrieve the compensation information from the memory to compensate the magnetic field sensor output for temperature.

2. The wearable audio device of claim 1, wherein the housing comprises an earbud body.

3. The wearable audio device of claim 1, wherein the housing is inside of an eyeglass temple piece.

4. The wearable audio device of claim 1, wherein the housing comprises a portion of an on-ear headphone.

5. The wearable audio device of claim 1, wherein the magnetometer system is configured to compensate the magnetic field sensor output when a magnetic field emanating from the wearable audio device is greater than a threshold level.

6. The wearable audio device of claim 1, wherein the temperature-dependent compensation information is determined for a plurality of wearable audio devices and a composite of these determinations is stored in the memory.

7. The wearable audio device of claim 1, wherein the temperature-dependent compensation information is determined relative to a reference temperature.

8. The wearable audio device of claim 1, wherein the magnetometer system is configured to compensate the magnetic field sensor output when the internal housing temperature exceeds a reference temperature by more than a predetermined amount.

9. An eyeglass headphone, comprising:

an eyeglass frame with a temple piece that is constructed and arranged to be positioned proximate an ear of a wearer;

an electro-acoustic transducer in the temple piece for creating audio output that is directed out of the temple piece, the electro-acoustic transducer producing a transducer magnetic field;

a coupling magnet in the temple piece and configured to couple the temple piece to another structure, wherein the coupling magnet has a coupling magnetic field;

a magnetometer system in the temple piece and comprising a magnetic field sensor that is configured to detect the Earth's magnetic field and has an output, the magnetometer system configured to derive from the magnetic field sensor output a directional heading of the Earth's magnetic field, wherein the magnetic field sensor is located within both the transducer magnetic field and the coupling magnetic field such that the transducer magnetic field and the coupling magnetic field affect the magnetic field sensor's detection of the Earth's magnetic field;

a temperature sensor that is configured to determine a temperature of the eyeglass frame;

a processor and associated memory in the temple piece, the magnetometer system configured to derive from the magnetic field sensor output a directional heading of the Earth's magnetic field;

wherein the magnetometer system is further configured to compensate the magnetic field sensor output to reduce heading errors caused at least in part by the transducer magnetic field and the coupling magnetic field, wherein the compensation is temperature dependent;

wherein the memory is configured to store temperature-dependent compensation information; and wherein the magnetometer system is further configured to use the temperature sensor output to retrieve compensation information from the memory to compensate the magnetic field sensor output for temperature.

10. The eyeglass headphone of claim 9, wherein the temperature-dependent compensation information is determined for a plurality of eyeglass headphones and a composite of these determinations is stored in the memory.

11. The eyeglass headphone of claim 9, wherein the magnetometer system is configured to compensate the magnetic field sensor output when the combined transducer magnetic field and the coupling magnetic field are greater than a threshold level.

12. The eyeglass headphone of claim 9, wherein the magnetometer system is configured to compensate the magnetic field sensor output when the sensed temperature exceeds a reference temperature by more than a predetermined amount.

* * * * *